United States Patent [19]
Kessler, Jr.

[11] 3,739,235
[45] June 12, 1973

[54] TRANSCALENT SEMICONDUCTOR DEVICE

[75] Inventor: Sebastian William Kessler, Jr., Lancaster, Pa.

[73] Assignee: RCA Corporation, New York, N.Y.

[22] Filed: Jan. 31, 1972

[21] Appl. No.: 222,244

[52] U.S. Cl...... 317/234 R, 317/234 A, 317/234 B, 165/105, 174/15

[51] Int. Cl............................. H01l 3/00, H01l 5/00

[58] Field of Search....................... 317/234, 1, 1.5, 317/2; 165/80, 105; 174/15

[56] References Cited

UNITED STATES PATENTS

| | | | |
|---|---|---|---|
| 3,586,932 | 6/1971 | Kokosa | 317/235 |
| 3,590,339 | 6/1971 | Bilo | 317/235 |
| 3,613,774 | 10/1971 | Bliss | 165/80 |
| 3,653,433 | 4/1972 | Scharli | 317/234 A |
| 3,654,528 | 4/1972 | Barkan | 317/234 |
| 3,673,306 | 6/1972 | Kirkpatrick | 165/105 X |

FOREIGN PATENTS OR APPLICATIONS

| | | | |
|---|---|---|---|
| 2,031,192 | 1/1971 | Germany | 165/105 |
| 914,034 | 12/1962 | Great Britain | 317/234 A |

OTHER PUBLICATIONS

IBM Technical Disclosure Bulletin; Combination Cooling System by Seely, Vol. 11, No. 7, Dec. 1968, pp. 838–839

The Heat Pipe, by Feldman et al., Mechanical Engineering, Feb. 1967, pp. 31–33

*Primary Examiner*—John W. Huckert
*Assistant Examiner*—Andrew J. James
*Attorney*—Glenn H. Bruestle and Irwin M. Krittman

[57] ABSTRACT

A transcalent semiconductor device, which may be a thyristor or transistor, comprises a semiconductor body having an emitter-gate junction intersecting a first surface thereof, adjacent to a gate electrode preferably disposed at or near the periphery of the first surface. A first heat pipe is formed with a portion of the first surface, including the junction-surface intersection, internal thereto. Opposite the first surface is a second surface of the body, which may be internal to a second heat pipe formed therewith.

11 Claims, 3 Drawing Figures

TRANSCALENT SEMICONDUCTOR DEVICE

The invention herein described was made in the course of or under a contract with the U.S. Department of the Army.

BACKGROUND OF THE INVENTION

This invention relates to a novel semiconductor device having improved transcalent capabilities.

Various semiconductor devices such as thyristors, which employ a plurality of electrodes, are switched between operating states by current pulses applied to the gate electrodes thereof. When a silicon-controlled-rectifier or SCR, for example, is switched from a blocking stat to a conducting state, current conduction is initiatd in the cathode emitter region immediately adjacent to the gate electrode, i.e., at the edge of the emitter-gate junction. An important operating parameter of an SCR is its so-called rate-of-current change, *di/dt*, which should have as high a value as possible. However, the *di/dt* value of an SCR is limited by the ability of the device to dissipate the heat generated at the edge of its emitter-gate junction. If excessive heat is generated, the SCR is destroyed.

To realize high *di/dt* values, several cooling arrangements for SCRs are employed in the prior art. Generally, an SCR body (also called a pellet or chip) is bonded to a solid heat-conducting member such as a copper cooling block. To avoid external shorting of the emitter-gate junction, an air gap may separate the junction from the cooling block or the block may be in contact with the emitter region only. With such arrangements, the heat generated at the edge of the emitter-gate junction is conducted through the thickness of the silicon body or laterally to the copper block. Both of these conduction paths, however, have higher thermal impedances than is desirable. As a result, high *di/dt* values are not realized and deratings must be imposed on prior art devices to prevent their destruction.

A versatile type of cooling device having several times the heat-transfer capability of even the best metallic conductors is known in the prior art as a heat pipe; see, for example, the article by G. Y. Eastman, "The Heat Pipe," *Scientific American*, 218, 38 (May 1968). Heat pipes have been employed in combination with electron tubes (see, for example, U.S. Pat. No. 3,405,299, issued to W. B. Hall et al. on October 8, 1968) and thermionic converter devices (see, for example, U.S. Pat. No. 3,441,752, issued to G. M. Grover et al. on Apr. 29, 1969). However, the satisfactory employment of heat pipes in cooling arrangements for semiconductor devices such as thyristors has presented problems which have not been solved in the prior art.

SUMMARY OF THE INVENTION

The novel semiconductor device comprises a semiconductor body having a first surface; a PN junction therein which extends to and intersects the first surface; electrically-insulating means disposed on the first surface and extending across the junction-surface intersection; metallizing means disposed on the insulating means; a first envelope having a discontinuity in the wall thereof, the wall being joined to the metallizing means such that the semiconductor body completely closes the discontinuity and the junction-surface intersection lies entirely within the closed first envelope; capillary means disposed within the closed first envelope, at least a portion of which capillary means is preferably disposed on the metallizing means; and a vaporizable working medium disposed within the closed first envelope. Preferably, the junction-surface intersection is proximate to a gate electrode disposed on the first surface, at or near the periphery thereof and outside the closed first envelope. Also preferably, a second envelope having a discontinuity in the wall thereof is joined to a second surface, opposed to the first surface, of the semiconductor body, such that the body completely closes the discontinuity in the wall of the second envelope; and the closed second envelope has disposed therein capillary means and a vaporizable working medium.

The electrically-insulating means disposed on the first surface of the semiconductor body surface across the junction-surface intersection protects the intersection against external shorting. The metallizing means disposed on the insulating means facilitates the joining of the discontinuous first envelope wall to the semiconductor body. By having a closed first envelope within which is disposed capillary means and a vaporizable working medium, a first heat pipe is formed with the first surface of the semiconductor body internal thereto. By having the junction-surface intersection within the closed first envelope, direct heat-pipe cooling of the intersection can be effected. Especially high *di/dt* values are realized when at least a portion of the capillary means is disposed on the metallizing means. If the junction-surface intersection is proximate to a gate electrode disposed on the first surface, the junction area around the intersection generally becomes one of highest heat generation during operation of the semiconductor device and one that can be most efficiently cooled by the first heat pipe. If the closed second envelope has disposed therein capillary means and a vaporizable working medium, a second heat pipe is formed with the second surface of the semiconductor body internal thereto and additional direct heat-pipe cooling can be employed in the device.

DESCRIPTION OF THE PREFERRED EMBODIMENTS

Figure 1:
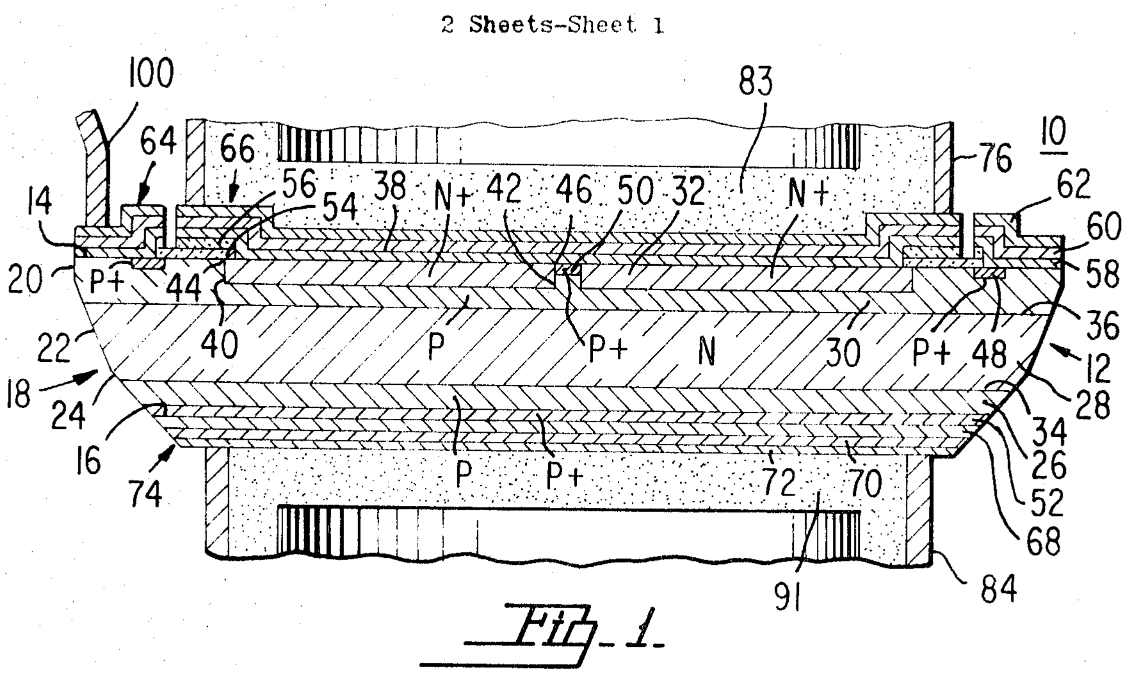
FIG. 1 is a detailed view, in axial section, of a portion of an example of the novel semiconductor device.
Figure 2:
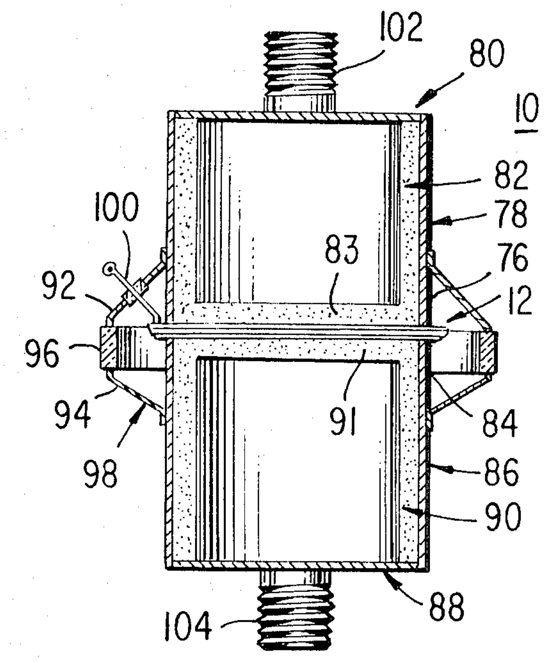
FIG. 2 is a longitudinal view, in axial section, of the full device shown partially in FIG. 1.

An example of the novel semiconductor device is shown in FIGS. 1 and 2. A transcalent thyristor 10 comprises an axially-symmetric semiconductor body 12 having opposed first and second surfaces 14 and 16, respectively, and an edge 18. The edge 18 has a vertical portion 20 and first and second angle-lapped portions 22 and 24, respectivley. Typically the body 12 is approximately 8.5 to 15 mils thick; the surfaces 14 and 16 are approximately 1.20 inches and 0.98 inches in diameter, respectively; and the edge portions 22 and 24 are at angles of approximately 60° to 70° and 80° to 85°, respectively, with the vertical portion 20.

As shown in FIG. 1, the body 12 comprises a P-type collector region 26 adjacent to the second surface 16 and extending to an N-type base region 28. The base region 28 is adjacent to a P-type base region 30, which extends to the N-type base region 28. The P-type base region 30 is in turn adjacent to an annular-shaped N-type emitter region 32 (designated N+), which extends to the base region 30 from the first surface 14. The four semiconductor regions 26, 28, 30 and 32 of alternate type conductivities form a PNPN configuration with PN junctions 34, 36, and 38, respectively, between the adjacent regions. A first portion 40 and a second portion 42 of the base-emitter PN junction 38 intersect the first surface 14 to produce outer and inner junction-surface intersections 44 and 46, respectively. Proximate to the first junction portion 40 is an annular-shaped portion 48 of the base region 30 extending to the first surface 14 of the body 12. The annular-shaped portion 48 is highly conductive (P+) relative to the remainder of the base region 30, to facilitate low-resistivity contact to the thyristor gate electrode described below. Contiguous with the second junction portion 42 is a central portion 50 of the base region 30 extending also to the first surface 14. The central portion 50 is highly conductive (P+) relative to the remainder of the base region 30, to provide electrical shorting across the second portion 42 of the base-emitter PN junction 38. Extending to the second surface 16 of the body 12 is a portion 52 of the emitter region 26. The portion 52 is highly conductive (P+) relative to the remainder of the emitter region 26, to facilitate low-resistivity contact to the thyristor anode electrode also described below.

Disposed on the first surface 14 of the body 12 is a thin annular-shaped electrically-insulating layer 54 extending across the outer junction-surface intersection 44 and in contact with the annular-shaped portion 48 of the base region 30. Typically, the insulating layer 54 is made of silicon dioxide thermally-grown to a thickness of approximately 6,000A. Disposed on the insulating layer 54 is a thin annular-shaped semiconductor bonding layer 56 having an annular opening therethrough. Typically, the semiconductor bonding layer 56 is made of poly-crystalline silicon deposited to a thickenss of approximately 14,000A. Disposed on the semiconductor bonding layer 56 and the exposed area of the first surface 14 is a thin first metallizing layer 58 having an annular opening therethrough aligned with the opening through the semiconducotr bonding layer 56. Typically, the first metallizing layer 58 is made of palladium evaporated to a thickness of approximately 1,000A. Disposed on the first metallizing layer 58 is a thin second metallizing layer 60 having an aligned annular opening therethrough. Typically, the second metallizing layer 60 is made of tungsten chemically-vapor-deposited to a thickness of approximately 1.0 to 1.5 microns. Disposed on the second metallizing layer 60 is a thin third metallizing layer 62 also having an aligned annular opening therethrough. Typically, the third metallizing layer 62 is made of nickel electrolytically-plated to a thickness of approximately 1 micron.

The outer portions of the first, second, and third metallizing layers 58, 60, ad 62, respectively, serve as the thyristor gate electrode 64. The inner or central portions of the first, second, and third metallizing layers 58, 60, and 62, respectively, are insulated from the outer portions thereof mainly by the insulating layer 54 and serve as the thyristor cathode electrode 66.

Disposed fully on the second surface 16 of the body 12 are, in the order named, thin fourth, fifth, and sixth metallizing layers 68, 70, and 72, respectively. Typically, the fourth, fifth, and sixth metallizing layers 68, 70, and 72, respectively, comprise materials and thicknesses corresponding to those of the first, second, and third metallizing layers 58, 60, and 62, respectively. The fourth, fifth, and sixth metallizing layers 68, 70, and 72, respectively, serve as the thyristor anode electrode 74.

Also as shown in FIG. 1, the third metallizing layer 62 has joined thereto, near the periphery of the inner or central portion thereof, a cylindrical first metal wall portion 76. As shown in FIG. 2, the first wall portion 76 is part of a first envelope wall 78 having a discontinuity therein, which discontinuity is completely closed by the semiconductor body 12. Typically, the first envelope wall 78 is made of nickel-plated copper, and the first wall portion 76 is soldered to the third metallizing layer 62 to produce a closed, vacuum-tight first envelope 80. Disposed within the closed first envelope 80 is a first capillary structure 82, a portion 83 of which is preferably disposed on and substantially covers the inner or central portion of the third metallizing layer 62. Typically, the first capillary structure 82 comprises a plurality of solder-plated copper particles (not shown), which are bonded to one another, as described in copending U.S. Patent application Ser. No. 104,920, filed on Jan. 8, 1971, by R. F. Keller. Also disposed within the closed first envelope 80 is a first working fluid (not shown), which is vaporizable at the operating temrperature of the thyristor 10 and of a quantity sufficient to saturate the first capillary structure 82. Typically, the first working fluid (not shown) is water. The closed first envelope 80, having disposed therein the first capillary structure 82 and the first working fluid (not shown), form a first heat pipe with the first surface 14 of the semiconductor body 12. The structure provides for direct physical contact of the first working fluid (not shown) and the inner or central portion of the third metallizing layer 62, which maximizes the heat conduction from the first portion 40 of the base-emitter PN junction 38 to the first working fluid (not shown).

Similarly, the sixth metallizing layer 72 has joined thereto, near the periphery thereof, a cylindrical second metal wall portion 84. The second metal wall portion 84 is part of a second envelope wall 86 having a discontinuity therein, which discontinuity is also completely closed by the semiconductor body 12, thereby producing a closed vacuum-tight second envelope 88. Disposed within the closed second envelope 88 is a second capillary structure 90, a portion 91 of which is preferably disposed on and substantially covers the sixth metallizing layer 72. Also disposed within the closed second envelope 88 is a second working fluid (not shown), vaporizable at the operating temperature of the thyristor 10 and of a quantity sufficient to saturate the second capillary structure 90. Typically, the second envelope wall 86, the second capillary structure 90, and the second working fluid (not shown) comprise materials and geometries corresponding to those of the first envelope wall 78, the first capillary structure 82, and the first working fluid (not shown), respectively. The closed second envelope 88, having disposed therein the second capillary structure 90 and the second working fluid (not shown), form a second heat pipe with the second surface 16 of the semiconductor body 12.

To protect the exposed portions of the body 12, particularly the PN junctions 34 and 36, from ambient conditions and to enhance the structural characteristics of the thyristor 10, a first metal flange 92 bonded to one end to the first envelope wall 78 and a second metal flange 94 bonded at one end to the second envelope wall 86 are sealed at their respective opposite ends to a ceramic member 96. The first metal flange 92, the second metal flange 94, and the ceramic member 96 form an hermetically-sealed third envelope 98 with the first and second envelope walls 78 and 86, respectively. To further protect the body 12, the third envelope 98 is typically filled with a dry inert gas.

Extending through the first metal flange 92, and insulated therefrom, is a gate lead 100 connected to the gate electrode 64, typically by soldering. Connected to the first envelope wall 78, which is in turn connected to the cathode electrode 66, is a cathode lead 102, shown as a threaded screw member in FIG. 2. Finally, connected to the second envelope wall 86, which is in turn connected to the anode electrode 74, is an anode lead 104, shown also as a threaded screw member.

Briefly, the transcalent thyristor 10 described above is made as follows. An N-type silicon wafer (not shown, but including the body 12), having a surface resistivity of approximately 40 to 60 ohms per square, has diffused into its first and second surfaces (correspondingly including the first and second body surfaces 14 and 16, respectively) an impurity such as boron, to produce the P-type regions 30 and 26, respectively, adjacent to the N-type region 28. The higher conductivity (P+) portion 52 of the P-type region 26 is produced by diffusing a higher concentration of boron impurity into the second wafer surface (not shown). Through the employement of well-known masking and photo-etching techniques, the higher conductivity (P+) portions 48 and 50 of the P-type region 30 are produced also by diffusing a higher concentration of boron impurity, into the first wafer surface (not shown). Well-known masking and photo-etching techniques are also employed in producing the N-type region 32, by diffusing an impurity such as phosphorus, from phosphorus oxychloride, into the first wafer surface (not shown).

An electrically-insulating layer (not shown, but including the insulaing layer 54), made of silicon dioxide thermally grown in a steam atmosphere at 900°C, is then produced on the first wafer surface (not shown). A layer of poly-crystalline silicon (not shown, but including the semiconductor bonding layer 56) is deposited on the insulaling wafer layer (not shown), by the dissociation of silane at 700°C. By next employing a junction mask (not shown) and photo-etching through the silicon dioxide and poly-crystalline silicon layers (not shown), the insulating layer 54 and the semiconducotor bonding layer 56 (absent the annular opening therethrough) are formed. The first metallizing layer 58 (also absent the opening therethrough) and the fourth metallizing layer 68 are produced by evaporating palladium on the second insulating layer 56 and the exposed area of the first wafer surface (not shown) and on the second wafer surface (not shown), respectively. The second metallizing layer 60 (absent the opening therethrough) and the fifth metallizing layer 70 are produced by chemically-vapor-depositing tungsten on the first and fourth metallizing layers 58 and 68, respectively. The third metallizing layer 62 (absent the opening therethrough) and the sixth metallizing layer 72 are in turn produced by electrolytically-plating nickel on the second and fifth metallizing layers 60 and 70, respectively.

Next, the aligned annular openings through the third, second, and first metallizing layers 62, 60, and 58, respectively, are successively produced by well-known masking and chemical etching techmniques. Then, the semiconductor body 12 (the edge 18 of which is at the time vertical, rather than angle-lapped) is diced out from the wafer (not shown), typically, by sandblasting. The body 12 is first mounted on a rotatable disc, after which the edge 18 is angle-lapped, using two unequal-diameter watch glasses to obtain the first and second angle-lapped edge portions 22 and 24, respectively. The body 12 is then dipped in solder, the solder (not shown) wetting all but the exposed silicon surfaces thereof; and the edge 18 is etched, typically in a boiling solution of sodium hydroxide, to remove any mechanical damage thereof. The aligned annular opening through the semicoductor bonding layer 56 is also produced by etching in the boiling solution of sodium hydroxide.

The first and second metal wall portions 76 and 84, respectively, are bonded to the solder-coated third and sixth metallizing layers 62 and 72, respectively. Also, the gate lead 100 is bonded to the solder-coated gate electrode 64. Next, the first and second capillary structures 82 and 90, respectively, are formed within the first and second wall portions 76 and 84, respectively, as described in copending U.S. Patent application Ser. No. 104,920, filed on Jan. 8, 1971, by R. F. Keller. The first and second heat pipes are then completed by adding the first and second working fluids (not shown) and sealing the open ends of the first and second envelope walls 78 and 86, respectively. Finally, the third envelope 98 is formed with the first and second wall portions 76 and 84, respectively.

The transcalent thyristor 10 described and made as above is capable particularly of fast turn-on and high rate-of-current-change (*di/dt*) performance, without the de-rating which must be imposed on prior art devices. Typical operating characteristics include: 400-ampere forward current, 800-ampere-per-microsecond *di/dt*, 250-milliampere holding current, 1,200-volt forward blocking voltage, and 200-volt-per-microsecond dv/dt, in an ambient temperature between −55°C and 70°C.

Figure 3:
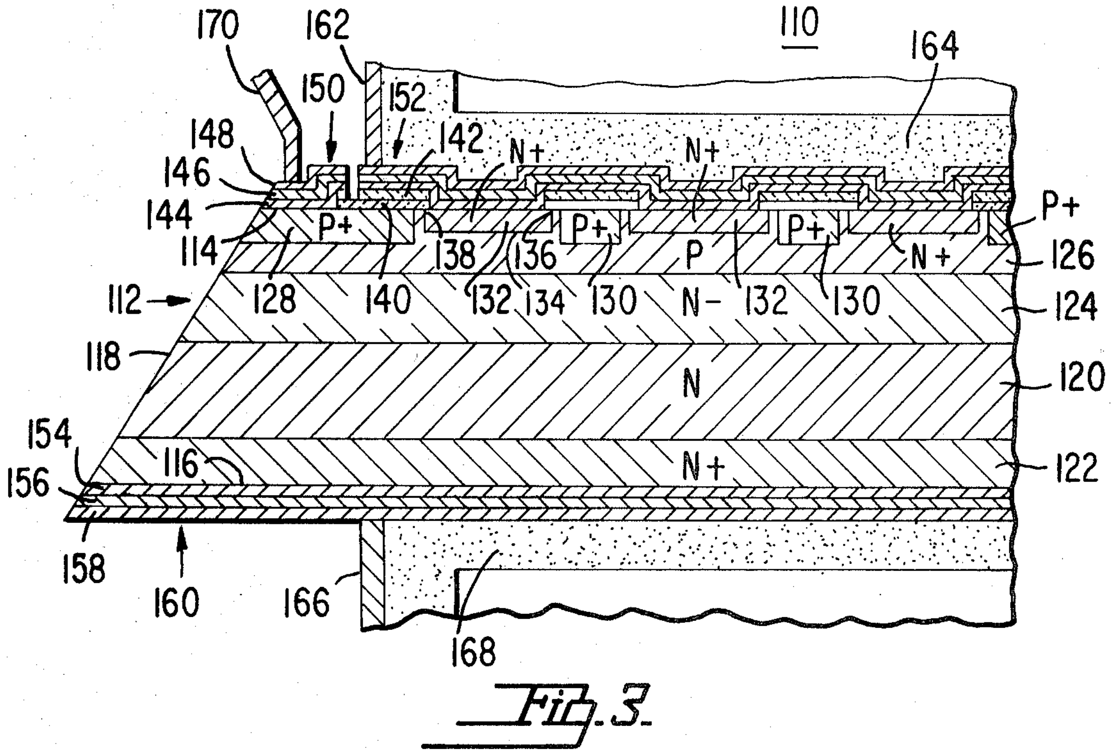
FIG. 3 is a detailed sectional view of a portion of another example of the novel semiconductor device.

Another example of the novel semiconductor device is shown in pertinent detail in FIG. 3. A transcalent transistor 110 comprises an axially-symmetric semiconductor body 112 having opposed first and second surfaces 114 and 116, respectively, and an angle-lapped edge 118. The body 112 comprises an N-type collector region 120, a higher conductive (N+) portion 122 of which extends to the second surface 116 and a lower conductive (N−) portion 124 of which is adjacent to a P-type base region 126. The base region 126 has an annular-shaped highly conductive (P+) first portion 128 extending to the first surface 114 and a plurality of spaced highly conductive (P+) second portions 130 also extending to the first surface 114. The base portions 128 and 130 are all interconnected in a digitated pattern. Disposed between the first and second base portions 128 and 130, respectively, and between the spaced second base portions 130 themselves are a plurality of N-type emitter region portions 132. The emitter portions 132 are all interconnected in another digitated pattern and interdigitated with the base portions 128 and 130. The emitter portions 132 extend from the first surface 114 to the base region 126, forming a PN junction 134 therewith. The base-emitter PN junction 134 has a portion 136 intersecting the first surface 114, to produce a junction-surface intersection 138.

Disposed on the first surface 114 of the body 112 are a plurality of electrically-insulating layer portions 140 interconnected in a digitated pattern and extending across the junction-surface intersection 138. Disposed on the insulating layer portions 140 are semiconductor bonding layer portions 142 also interconnected in a digitated pattern. Disposed on the semiconductor bonding layer portions 142 and the exposed area of the first surface 114 is a first metallizing layer 144. Disposed on the first metallizing layer 144 is a second metallizing layer 146, on which is disposed a third metallizing layer 148. The outer portions of the first, second, and third metallizing layers 144, 146, and 148, respectively, are insulatd from the inner or central portions thereof by means of aligned openings through the layers 144, 146, and 148 and the insulating layer portions 140. The outer portions of the first, second, and third metallizing layers 144, 146, and 148, respectively, serve as the transistor base or "gate" electrode 150. The inner or central portions of the first, second, and third metallizing layers 144, 146, and 148, respectively, serve as the transistor emitter electrode 152.

Disposed on the second surface 116 of the body 112 is a fourth metallizing layer 154, on which is disposed a fifth metallizing layer 156. Disposed on the fifth metallizing layer 156 is a sixth metallizing layer 158. The fourth, fifth, and sixth metallizing layers 154, 156, and 158, respectively, serve as the transistor collector electrode 160. The semiconductor body regions, insulating layer, semiconductor bonding layer, and metallizing layers of the transcalent transistor 110 may comprise materials and thicknesses similar to those of the semiconductor body regions, insulating layer, semiconductor bonding layer, and metallizing layers, respectively, of the transcalent thyristor 10 shown in FIG. 1 and described above.

The third metallizing layer Disposed of the transistor 110 has joined thereto, near the periphery of the inner or central portion thereof, a cylindrical first metal wall portion 162. The first wall portion 162 is part of a first envelope wall (not shown) having a discontinuity therein, which discontinuity is completely closed by the semiconductor body 112 to produce a closed, vacuum-tight first envelope (not shown). Disosed within the closed first envelope (not shown) is a first capillary structure a portion 164 of which is preferably disposed on and substantially covers the inner or central portion of the third metallizing layer 148. Also disposed within the closed first envelope (not shown) is a first working fluid (not shown), which is vaporizable at the operating temperature of the transistor 110 and of a quantity sufficient to saturate the first capillary structure including the portion 164.

Similarly, the sixth metallizing layer 158 has joined thereto, near the periphery thereof, a cylindrical second metal wall portion 166. The second wall portion 166 is part of a second envelope wall (not shown) having a discontinuity therein, which discontinuity is also completely closed by the semiconductor body 112 to produce a closed, vacuum-tight second envelope (not shown). Disposed within the closed second envelope (not shown) is a second capillary structure a portion 168 of which is preferably disposed on and substantially covers the sixth metallizing layer 158. Also disposed within the closed second envelope (not shown) is a second working fluid (not shown), which is vaporizable at the operating temperature of the transistor 110 and of a quantity sufficient to saturate the second capillary structure including the portion 168.

To protect the exposed portion of the body 112 from ambient conditions and to enhance the structural characteristics of the transistor 110, a third envelope (not shown) is formed with the first and second envelope walls (not shown). Extending through a wall of the third evelope (not shown) is a gate lead 170 connected to the gate electrode 150. The envelope walls, capillary structures, and working fluids of the transcalent transistor 110 may comprise materials and geometries similar to those of the envelope walls, capillary structures, and working fluids, respectively, of the transcalent thyristor 10 shown in FIG. 2 and described above.

GENERAL CONSIDERATIONS

It should be understood that the invention is not limited to the embodiments described above. For example, the transcalent device may be other than a thyristor or transistor. The various semiconductor regions may be of conductivity types opposite to those shown in FIGS. 1 and 3, and the geometries of these regions may be other than those shown and described. Hence, the thyristor, transistor, or other semiconductor body may employ either an annular or interdigitated gate and cathode or base and emitter structure.

The insulating means may be other than a thermally-grown silicon dioxide layer. The metallizing means may be other than the palladium-tungsten-nickel combination described above; for example, the first (and fourth) metallizing layer may be made of platinum as well as palladium. Also, depending upon the insulating and metallizing means employed, the bonding-means may be other than a poly-crystalline-silicon layer or may even be entirely eliminated.

Various combinations of heat pipe envelope wall, capillary structure, and working fluid materials and geometries may be employed. Many such combinations are discussed, for example, in the article by G. Y. Eastman, "The Heat Pipe-A Progress Report," *Proceedings of 4th Intersociety Energy Conversion Engineering Conference* (September 1969). Also, in some applications, the second heat pipe may be eliminated.

What is claimed is:

1. A semiconductor device comprising:

a. a semiconductor body having a surface;

b. a first region of one-type conductivity in said body;

c. a second region of a type conductivity opposite to said one-type conductivity in said body,
   said second region extending to said first region from said surface with a PN junction between said first and second regions, a portion of said junction intersecting said surface;

d. electrically-insulating means disposed on said surface and extending across the junction-surface intersection;

e. metallizing means disposed on said insulating means;

f. an envelope having a discontinuity in the wall thereof, said wall being joined to said metallizing means such that said semiconductor body completely closes said discontinuity and said junction-surface intersection lies entirely within the closed envelope;

g. capillary means disposed within said closed envelope; and h. a vaporizable working medium disposed within said closed envelope.

2. A semiconductor device comprising:

a. a semiconductor body having a surface;

b. a first region of one-type conductivity in said body;

c. a second region of a type conductivity opposite to said one-type conductivity in said body, said second region extending to said first region from said surface with a PN junction between said first and second regions, a portion of said junction intersecting said surface;

d. electrically-insulating means disposed on said surface and extending across the junction-surface intersection;

e. a gate electrode disposed on said surface in contact with said first region and proximate to said junction-surface intersection;

f. metallizing means disposed on said insulating means and in contact with said second region;

g. an envelope having a discontinuity in the wall thereof, said wall being joined to said metallizing means such that said semiconductor body completely closes said discontinuity, said junction-surface intersection lies entirely within the closed envelope, and said gate electrode lies outside the closed envelope;

h. capillary means disposed within said closed envelope; and i. a vaporizable working medium dsposed within said closed envelope.

3. The semiconductor device of claim 2, wherein said metallizing means extends across said second region.

4. The semiconductor device of claim 3, wherein at least a portion of said capillary means is disposed on said metallizing means.

5. The semiconductor device of claim 2, wherein said gate electrode is disposed at or near the periphery of said surface.

6. A semiconductor device comprising:

a. a semiconductor body having a first surface;

b. a first region of one-type conductivity in said body;

c. a second region of a type conductivity opposite to said one-type conductivity in said body, said second region extending to said first region from said first surface with a PN junction between said first and second regions, a portion of said junction intersecting said first surface;

d. electrically-insulating means disposed on said first surface and extending across the junction-surface intersection;

e. first metallizing means disposed on said insulating means and extending across said first surface, said first metallizing means having an opening therethrough extending to said insulating means such that the peripheral portion of said first metallizing means is in contact with said first region and the inner portion of said first metallizing means is in contact with said second region, said peripheral portion serving as a gate or base electrode and said inner portion serving as a cathode or emitter electrode, respectively;

f. a first envelope having a discontinuity in the wall thereof, said first envelope wall being joined to said inner portion of said first metallizing means such that said semiconductor body completely closes said first envelope discontinuity and said junction-surface intersection lies entirely within the closed first envelope;

g. first capillary means disposed within said closed first envelope, at least a portion of said first capillary means being disposed on said inner portion of said first metallizing means; and h. a first vaporizable working medium disposed within said closed first envelope.

7. The semiconductor device of claim 6, further comprising:

i. a second surface opposite to said first surface of said body;

j. second metallizing means disposed on and extending across said second surface;

k. a second envelope having a discontinuity in the wall thereof, said second envelope wall being joined to said second metallizing means such that said semiconductor body completely closes said second envelope discontinuity;

l. second capillary means disposed within said closed second envelope, at least a portion of said second capillary means being disposed on said second metallizing means; and m. a second vaporizable working medium disposed within said closed second envelope.

8. The semiconductor device of claim 7, further comprising:

n. an edge having portions coextensive with said first and second surfaces of said body; and o. means connected to said first and second envelope walls for protecting said edge from ambient conditions.

9. The semiconductor device of claim 6, wherein said first and second regions comprise regions of a thyristor body.

10. The semiconductor device of claim 6, wherein said first and second regions comprise regions of a transistor body.

11. A semiconductor device comprising:

a. a semiconductor body having a surface;

b. a junction of two regions of differing conductivities in said body, a portion of said junction intersecting said surface;

c. electrically-insulating means disposed on said surface and extending across the junction-surface intercept; and d. a heat pipe having a discontinuous envelope wall, said wall being joined to said insulating means such that said semiconductor body completely closes said discontinuity and said junction-surface intercept lies entirely within the closed envelope.

* * * * *